Sept. 8, 1970 B. J. STERN 3,527,959

TRANSISTOR NOR GATE

Filed Sept. 11, 1967

CIRCUIT OF FIG. 1

INVENTOR

Barry J. Stern

BARRY J. STERN 3,527,959

TRANSISTOR NOR GATE

Barry J. Stern, P.O. 2112, Indiana Instruments Inc., Hammond, Ind. 46323

Filed Sept. 11, 1967, Ser. No. 670,823
Int. Cl. H03k *19/34*
U.S. Cl. 307—215 5 Claims

ABSTRACT OF THE DISCLOSURE

A nine terminal basic logic module comprising a transistor NOR gate with one capacitor input. The nine terminals of the basic logic module are arranged with respect to one another as the elements of a 3 x 3 matrix. All components are arranged between these nine terminals so that the sum of the component lead length is minimum. Several basic logic modules are arranged with respect to one another as the elements of a matrix.

Figure 1:
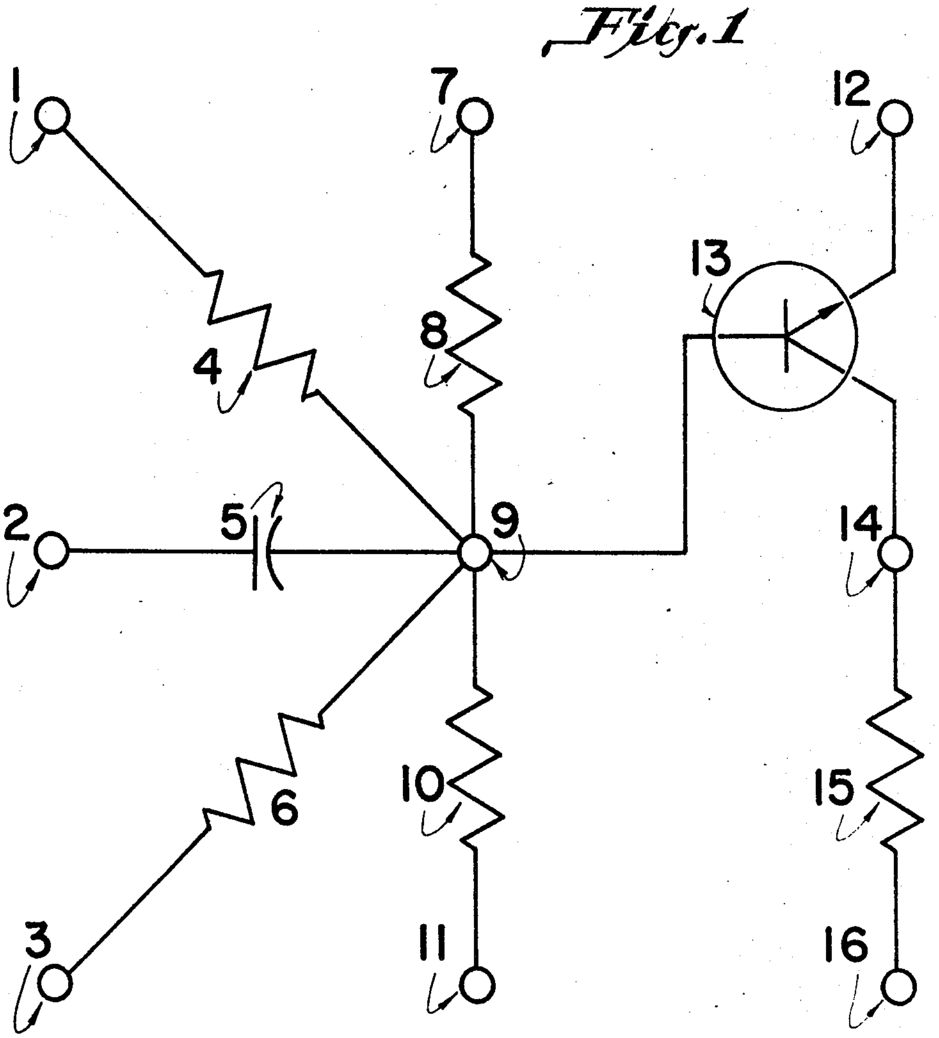
Figure 2:
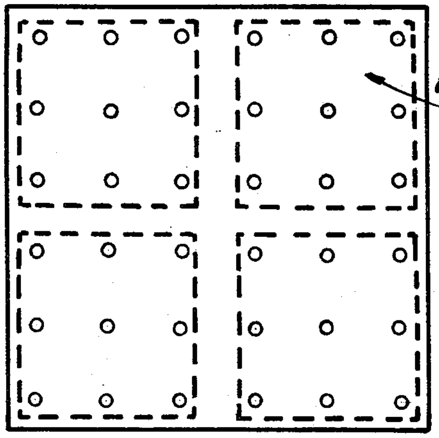

The present invention relates to an improvement in the transistor NOR gate as a building block for logic systems. The improvement consists of adding to the transistor NOR gate, in addition to at least two resistive inputs, at least one purely capacitive input. Four of the resulting logic modules may be interconnected to form a G–H flip-flop as disclosed in patent application No. 576,317. Seven of the resulting logic modules may be interconnected to form a time delay circuit as disclosed in patent application No. 639,151. It is an object of the present invention to provide a basic logic module for the G–H flip-flop as disclosed in patent application No. 576,317.

It is an object of the present invention to provide a basic logic module for the time delay circuit as disclosed in patent application No. 639,151.

It is an object of the present invention to provide a basic logic module with a physical arrangement of inputs and outputs with respect to one another as the elements of a 3 x 3 matrix It is an object of the present invention to provide a basic logic module with a physical arrangement of components between inputs and outputs so that the sum of the component lead length is a minimum.

It is an object of the present invention to provide a logic system comprised of several logic modules which are arranged with respect to one another as the elements of a matrix. FIG. I illustrates the circuit schematic of the basic logic module with a physical arrangement of inputs and outputs with respect to one another as the elements of a 3 x 3 matrix and a physical arrangement of components between the inputs and outputs so that the sum of the component lead length is a minimum.

FIG. II illustrates a logic system comprised of four basic logic modules of FIG. I which are arranged with respect to one another as the elements of a matrix. Terminal posts of FIG. I are identified by 1, 7, 12, 2, 9, 14, 3, 11, and 16. These terminals are arranged with respect to one another as the elements of a 3 x 3 matrix. Input base resistors of FIG. I are identified by 4, 8, 6, and 10. The load resistor of FIG. I is identified by 15. The input capacitor of FIG. I is identified by 15. The input capacitor of FIG. I is identified by 5. The transistor of FIG. I is identified by 13.

Any equal potential surface may serve as a terminal post. The components are fastened, soldered, plated or fabricated between the terminal posts.

The values of the base resistors and their respective input voltages must be adjusted with respect to the collector load resistor and the transistor parameters so that the output voltage of one basic logic module as the input voltage to the next basic logic module produces the same output voltage. One way of realizing this condition is to adjust the above values so that the transistor is saturated. For high speed operation this condition may be realized without saturation by a back clamping diode connected from the base to the collector of the transistor. For high speed operation the value of the capacitor is reduced to as low as value as possible for reliable operation of the G–H flip-flop as disclosed in patent application No. 576,317. Typical values of the components of the basic logic module for 100 kc. operation with collector loads up to 30 ma. are 10K for the base resistors, 1K for the collector load resistor, 25O$\mu\mu$fd. for the capacitor input, and a 2N2714 transistor.

It is contemplated that numerous variations and modifications within the purview of those skilled in the art can be made in the improvement in the transistor NOR gate, and it is intended to cover in the appended claims all variations and modifications as fall within the true spirit and scope of the invention.

What is claimed is:

1. A basic logic module which comprises nine terminal posts arranged with respect to one another as the elements of a 3 x 3 matrix, four base resistors, one load resistor, one capacitor, and one transistor fastened, soldered, plated or fabricated between said terminal posts, one of said terminal posts connected to each of the leads of said base resistors, a lead of said capacitor, and the base lead of said transistor, one of said terminal posts connected to a lead of said load resistor and to the collector lead of said transistor, and seven of said terminal posts connected to one and only one of the leads of said components.

2. The basic logic module of claim 1 wherein the sum of all component lead length for a given terminal post spacing is minimum.

3. The basic logic module of claim 2 with capacitor input and collector in line.

4. A logic system comprised of the basic logic module of claim 1.

5. The logic system of claim 4 wherein all terminals are arranged with respect to one another as the elements of a matrix.

References Cited

UNITED STATES PATENTS

| | | | |
|---|---|---|---|
| 3,153,200 | 10/1964 | Wahrman | 307—215 |
| 3,395,265 | 7/1968 | Weir | 307—303 |
| 2,891,172 | 6/1959 | Bruce | 307—214 |

FOREIGN PATENTS 370,823 7/1963 Switzerland.

OTHER REFERENCES

R. K. Richards, "Digital Computer Components and Circuits," November 1957, pp. 165 and 166.

R. K. Richards, "Arithmetic Operations in Digital Computers," February 1955, pp. 71 and 72.

JOHN S. HEYMAN, Primary Examiner
D. M. CARTER, Assistant Examiner

U.S. Cl. X.R.

307—303